United States Patent [19]

Heikkilä

[11] Patent Number: 5,477,162
[45] Date of Patent: Dec. 19, 1995

[54] METHOD FOR DETERMINING THE SHORT-CIRCUIT INDUCTANCE OF AN ASYNCHRONOUS MACHINE

[75] Inventor: Samuli Heikkilä, Helsinki, Finland

[73] Assignee: ABB Industry Oy, Helsinki, Finland

[21] Appl. No.: 256,274
[22] PCT Filed: Dec. 21, 1992
[86] PCT No.: PCT/FI92/00354
§ 371 Date: Aug. 24, 1994
§ 102(e) Date: Aug. 24, 1994
[87] PCT Pub. No.: WO93/14410
PCT Pub. Date: Jul. 22, 1993

[30] Foreign Application Priority Data

Jan. 9, 1992 [FI] Finland ......... 920090

[51] Int. Cl.$^6$ ......... G01R 27/26
[52] U.S. Cl. ......... 324/772
[58] Field of Search ......... 324/772

[56] References Cited

U.S. PATENT DOCUMENTS 4,649,341  3/1987  Ulbrich et al. .

FOREIGN PATENT DOCUMENTS

| 0288704A1 | 11/1988 | European Pat. Off. . |
| 0441649A2 | 8/1991 | European Pat. Off. . |
| 2040054 | 8/1980 | United Kingdom . |
| 2059604 | 4/1981 | United Kingdom . |

*Primary Examiner*—Kenneth A. Wieder
*Assistant Examiner*—Mark Wardas
*Attorney, Agent, or Firm*—Watson, Cole, Grindle & Watson

[57] ABSTRACT

A method of determining a short-circuit inductance in an asynchronous machine even during operation of the machine includes the steps of causing a step change in the stator voltage ($\bar{u}_s$); measuring both the stator voltage ($\bar{u}_s$) and the stator current derivative ($\bar{i}'_s$) both before and after the step change in the stator voltage; determining the difference between the measured stator voltages ($\bar{u}_s(t_1)$, $\bar{u}_s(t_2)$) and the difference between the measured stator current derivatives ($\bar{i}'_s(t_1)$, $\bar{i}'_s(t_2)$); and determining the quotient of the difference between the stator voltages and the difference between the stator current derivatives for obtaining a short-circuit inductance ($\sigma L_s$).

8 Claims, 2 Drawing Sheets

METHOD FOR DETERMINING THE SHORT-CIRCUIT INDUCTANCE OF AN ASYNCHRONOUS MACHINE

This invention relates to a method of determining a short-circuit inductance in an asynchronous machine, wherein the short-circuit inductance is determined by means of a stator voltage and a stator current derivative of the machine.

Control of an asynchronous machine usually aims at a desired behaviour of the torque created by the machine when the current and voltage supplied to the machine are known. One thus attempts to affect the electric torque, the relative value of which as a function of the stator flux and stator current is:

$$T = (\bar{\psi}_s \times \bar{i}_s), \quad (1)$$

where

T = electric torque,
$\bar{\psi}_s$ = stator flux, and
$\bar{i}_s$ = stator current.

Proper torque control thus requires that not only the current $\bar{i}_s$ but also the stator flux of the machine or a parameter proportional to it (such as the rotor or air gap flux) is known.

Methods for calculating the stator flux are based on the well-known differential and current equations of the stator and rotor of an asynchronous machine, which are as follows in the coordinate system of the stator:

$$\bar{u}_s = R_s \bar{i}_s + \frac{d\bar{\psi}_s}{dt} \quad (2)$$

$$0 = R_r \bar{i}_r + \frac{d\bar{\psi}_r}{dt} - j\omega_m \bar{\psi}_r \quad (3)$$

$$\bar{\psi}_s = L_s \bar{i}_s + L_m \bar{i}_r \quad (4)$$

$$\bar{\psi}_r = L_r \bar{i}_r + L_m \bar{i}_s \quad (5)$$

$$0 = R_r \bar{i}_r + d\bar{\psi}_r/dt - j\omega_m \bar{\psi}_r \quad (3)$$

$$\bar{\psi}_s = L_s \bar{i}_s + L_m \bar{i}_r \quad (4)$$

$$\bar{\psi}_r = L_r \bar{i}_r + L_m \bar{i}_s \quad (5)$$

where $\bar{\psi}_r$ = rotor flux,
$\bar{i}_r$ = rotor current,
$\bar{u}_s$ = stator voltage,
$R_s$ = stator resistance,
$R_r$ = rotor resistance,
$L_s$ = stator inductance,
$L_r$ = rotor inductance,
$L_m$ = primary inductance, and
$\omega_m$ = mechanical rotation rate.

The object is to calculate the stator flux by means of the measured stator current and stator voltage, and so the rotor flux and rotor current have to be eliminated from the above equations. Using Eq. 4 and 5, the rotor flux and rotor current are first solved as a function of the stator flux and stator current:

$$\bar{\psi}_r = \frac{L_r}{L_m} (\bar{\psi}_s - \sigma L_s \bar{i}_s) \quad (6)$$

$$\bar{i}_r = \frac{1}{L_m} (\bar{\psi}_s - L_s \bar{i}_s) \quad (7)$$

where $$\sigma = 1 - \frac{L_m^2}{L_s L_r} = \text{dispersion coefficient,}$$

and $\sigma L_s$ = short-circuit inductance.

Using Eq. 6 and 7, Eq. 2 and 3 are reduced into the following form:

$$\frac{d\bar{\psi}_s}{dt} = \bar{u}_s - R_s \bar{i}_s \quad (8)$$

$$\frac{d\bar{\psi}_s}{dt} = \sigma L_s \frac{d\bar{i}_s}{dt} - \frac{1}{\tau_r}(\bar{\psi}_s - L_s \bar{i}_s) + j\omega_m(\bar{\psi}_s - \sigma L_s \bar{i}_s), \quad (9)$$

where $$\tau_r = \frac{L_r}{R_r} = \text{rotor time constant.}$$

Most prior art stator flux calculation methods utilize either Eq. 8 or Eq. 9 or both of them. When using Eq. 8 alone, it is not possible to effect proper control at very low frequencies, wherefore the best methods always use either Eq. 9 or both equations.

One crucial parameter required in Eq. 9 is the short-circuit inductance. To deduce one method for calculating it, the derivative of the rotor flux is discussed first, which is on the basis of Eq. 2 and 6:

$$\frac{d\bar{\psi}_r}{dt} = \frac{L_r}{L_m} \left( \frac{d\bar{\psi}_s}{dt} - \sigma L_s \frac{d\bar{i}_s}{dt} \right) \quad (10)$$

$$= \frac{L_r}{L_m} \left( \bar{u}_s - R_s \bar{i}_s - \sigma L_s \frac{d\bar{i}_s}{dt} \right)$$

Introducing Eq. 10 into Eq. 3 gives:

$$\sigma L_s \frac{d\bar{i}_s}{dt} = \bar{u}_s + \bar{u}_0, \quad (11)$$

where $\bar{u}_0$ is a voltage depending on the state of the machine:

$$\bar{u}_0 = \frac{L_m}{L_r} (R_r \bar{i}_r - j\omega_m \bar{\psi}_r) - R_s \bar{i}_s \quad (12)$$

At the starting time of the asynchronous machine (indicated with the reference $t_0$) the stator and rotor currents and fluxes are zero, so that $\bar{u}_0(t_0) = 0$, and it follows from Eq. 11 that $$\sigma L_s \bar{i}'_s(t_0) = \bar{u}_s(t_0) \quad (13)$$

where $\bar{i}'_s(t_0)$ is the derivative of the stator current at the time $t_0$.

Accordingly, the stator current starts to increase in the direction of the stator voltage with a slope $\bar{u}_s(t_0)/\sigma L_s$ when a predetermined voltage $\bar{u}_s(t_0)$ is supplied to an unmagnetized machine. The situation is illustrated in FIG. 1, which shows a voltage $u_s$ and a current $i_s$ as a function of time in a starting situation described above.

One prior art way of determining $\sigma L_s$ is, in fact, based on measuring the stator voltage and the derivative of the stator current of the machine at the starting time, and so the short-circuit inductance can be calculated on the basis of Eq. 13 directly as a ratio between them:

$$\sigma L_s = \frac{\bar{u}_s(t_0)}{\bar{i}_s'(t_0)} \tag{14}$$

A drawback of the above-described method is that $\sigma L_s$ is determined only at the starting time, whereafter it is assumed to remain constant. Like the other inductances of a machine, the short-circuit inductance may actually vary considerably during operation due to the fact that the saturation state of the magnetic flux of the stator or the rotor varies with the operating point of the machine.

The object of the present invention is to provide a method of determining a short-circuit inductance estimate, which does not have the limitations and problems described above and which may be applied during the operation of the machine as well. This is achieved by means of a method according to the invention, which is characterized in that it comprising the steps of causing a step change in the stator voltage; measuring both the stator voltage and the stator current derivative both before and after said step change in the stator voltage; determining the difference between the measured stator voltages and the difference between the measured stator current derivatives; and determining the quotient of the difference between the stator voltages and the difference between the stator current derivatives for obtaining a short-circuit inductance.

In the method, an unknown voltage component $\bar{u}_0$ deviating from zero during the normal operation of the machine is eliminated from Eq. 11 so that in place of observing an individual value of the derivative of the stator current one observes a change caused in it by a step change in the stator voltage.

In the following the invention will be described in greater detail with reference to the attached drawings, in which FIGS. 1a and 1b show examples of the absolute values of the stator voltage and the stator current, respectively, as a function of time, when the stator voltage of an unmagnetized machine undergoes a step change at a time $t_0$;

Figure 1A:
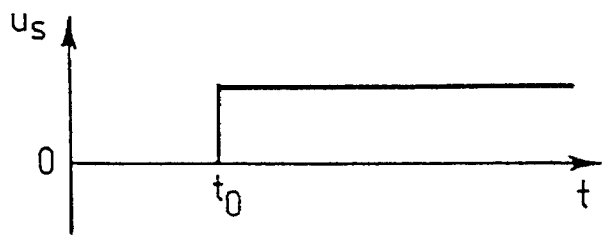
Figure 1B:
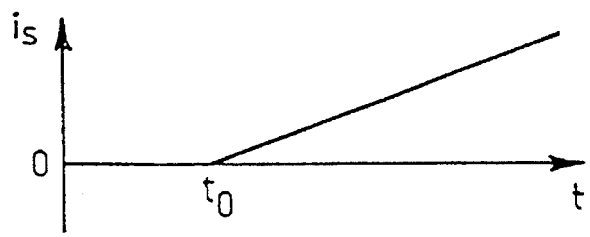
Figure 2A:
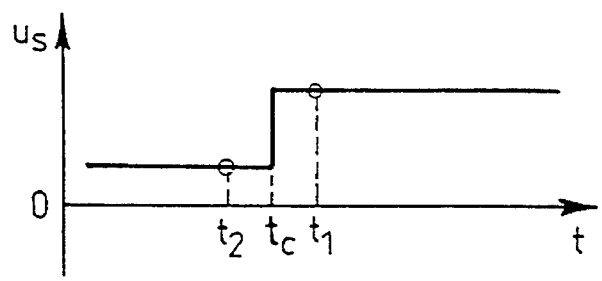
FIGS. 2a and 2b show examples of the absolute values of the stator voltage and the stator current, respectively, as a function of time, when the stator voltage of a magnetized rotating machine undergoes a step change at a time $t_c$.
Figure 2B:
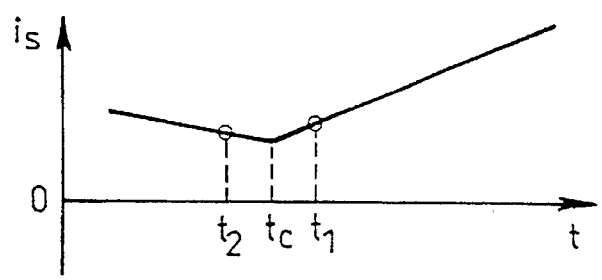

Assume that the stator voltage of a magnetized rotating asynchronous machine undergoes a step change at a time $t_c$, and that the stator voltage and the derivative of the stator current have been measured a little before this change at a time $t_2$ and a little after the change at a time $t_1$ (FIG. 2). As Eq. 11 is valid both at the time $t_1$ and the time $t_2$, the following interdependence will occur between the measured parameters:

$$\sigma L_s \bar{i}_s'(t_1) = \bar{u}_s(t_1) + \bar{u}_0(t_1) \tag{15}$$

$$\sigma L_s \bar{i}_s'(t_2) = \bar{u}_s(t_2) + \bar{u}_0(t_2) \tag{16}$$

In practice, the currents and fluxes of an asynchronous machine are not capable of changing step by step, so that, according to Eq. 12, the voltage component $\bar{u}_0$ is a continuous function in the time domain, for which is true:

$$\lim_{t \to t_c^-} \{\bar{u}_0(t)\} = \lim_{t \to t_c^+} \{\bar{u}_0(t)\} = \bar{u}_0(t_c) \tag{17}$$

When the measuring times $t_1$ and $t_2$ are set very close to the time of change $t_c$, it follows from Eq. 17:

$$\bar{u}_0(t_1) \approx \bar{u}_0(t_2) \tag{18}$$

The values of the derivative of the stator current should thus be measured immediately before and immediately after the time of change of the stator voltage. In practice, this means that the derivatives of the stator current are determined e.g. about 100 μs before and after the change of the stator voltage in a machine having a rotor time constant of about 100 ms. Generally speaking, it is conceivable that the time lapse between each measuring time and the time of change of the stator voltage is set such that it is no more than one thousandth part of the rotor time constant of the machine.

When both sides of Eq. 16 are subtracted from the respective sides of Eq. 15, and the approximate equation 18 is applied, one gets:

$$\sigma L_s(\bar{i}_s'(t_1) - \bar{i}_s'(t_2)) = \bar{u}_s(t_1) - \bar{u}_s(t_2) + \bar{u}_0(t_1) - \bar{u}_0(t_2) \tag{19}$$
$$\approx \bar{u}_s(t_1) - \bar{u}_s(t_2)$$

It is noted that when the stator voltage undergoes a step change, a corresponding change in the derivative of the stator current depends only on the magnitude of the voltage change besides the short-circuit inductance. An individual current derivative depends both on the stator voltage and the voltage $\bar{u}_0$ (Eq. 11), which, however, is reduced in Eq. 19, as $\bar{u}_0(t)$ is constant over a short period of time irrespective of the variation in the supply voltage.

By solving Eq. 19 with respect to $\sigma L_s$, it is noted that the short-circuit inductance estimate can be calculated by dividing the instantaneous change of the stator voltage by the corresponding change of the derivative of the stator current:

$$\sigma L_s = \frac{\bar{u}_s(t_1) - \bar{u}_s(t_2)}{\bar{i}_s'(t_1) - \bar{i}_s'(t_2)} \tag{20}$$

Figure 3:
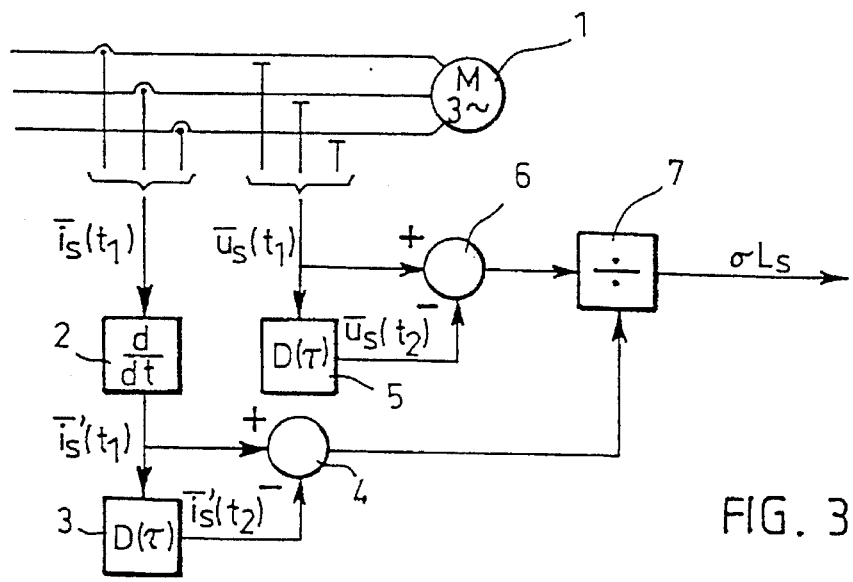
FIG. 3 is a flow chart illustrating a method of estimating the short-circuit inductance of an asynchronous machine according to the invention.

The method according to the invention is illustrated by means of the flow chart in FIG. 3, in which the symbol r is used to represent the time difference between the measuring times $t_1$ and $t_2$:

$$t_1 - t_2 \tau \tag{21}$$

In blocks 3 and 5, a delay operator D is used, which is defined as follows:

$$D(\tau)f(t) = f(t - \tau), \tag{22}$$

where f is an arbitrary function of t delayed by a period of time corresponding to $\tau$ when multiplied by $D(\tau)$.

It is further required in the method of FIG. 3 that there occurs a step change in the stator voltage between the times $t_1$ and $t_2$. This requirement does not involve practical problems as typical asynchronous machine applications requiring parameter identification are usually based on frequency converters controlling the stator voltage step by step. The estimation of $\sigma L_s$ should only be synchronized so that changes in the stator voltage fall between the times $t_1$ and $t_2$.

In FIG. 3, the stator current $\bar{i}_s(t_1)$ of the asynchronous machine 1, obtained by measuring at the time $t_1$, is first differentiated in block 2 to obtain a derivative $\bar{i}'_s(t_1)$. In block 3, $\bar{i}'_s(t_1)$ is delayed by a period of time corresponding to $\tau$, so that $\bar{i}'_s(t_2)$ is obtained from the output of this block. Block 4 is a summing means, in which the latter delayed derivative is subtracted from the previous one, and the output of which corresponds to the denominator of Eq. 20. Correspondingly, the stator voltage $\bar{u}_s(t_1)$ obtained by measuring at the time $t_1$ is first delayed by a period of time corresponding to $\tau$ in block 5 to obtain $\bar{u}_s(t_2)$. Thereafter the latter delayed voltage is subtracted from the previous one in block 6, the output of which corresponds to the numerator of Eq. 20. Finally, the output of block 6 is divided in block 7 by the output of block 4 to obtain the short-circuit inductance estimate based on Eq. 20.

Figure 4:
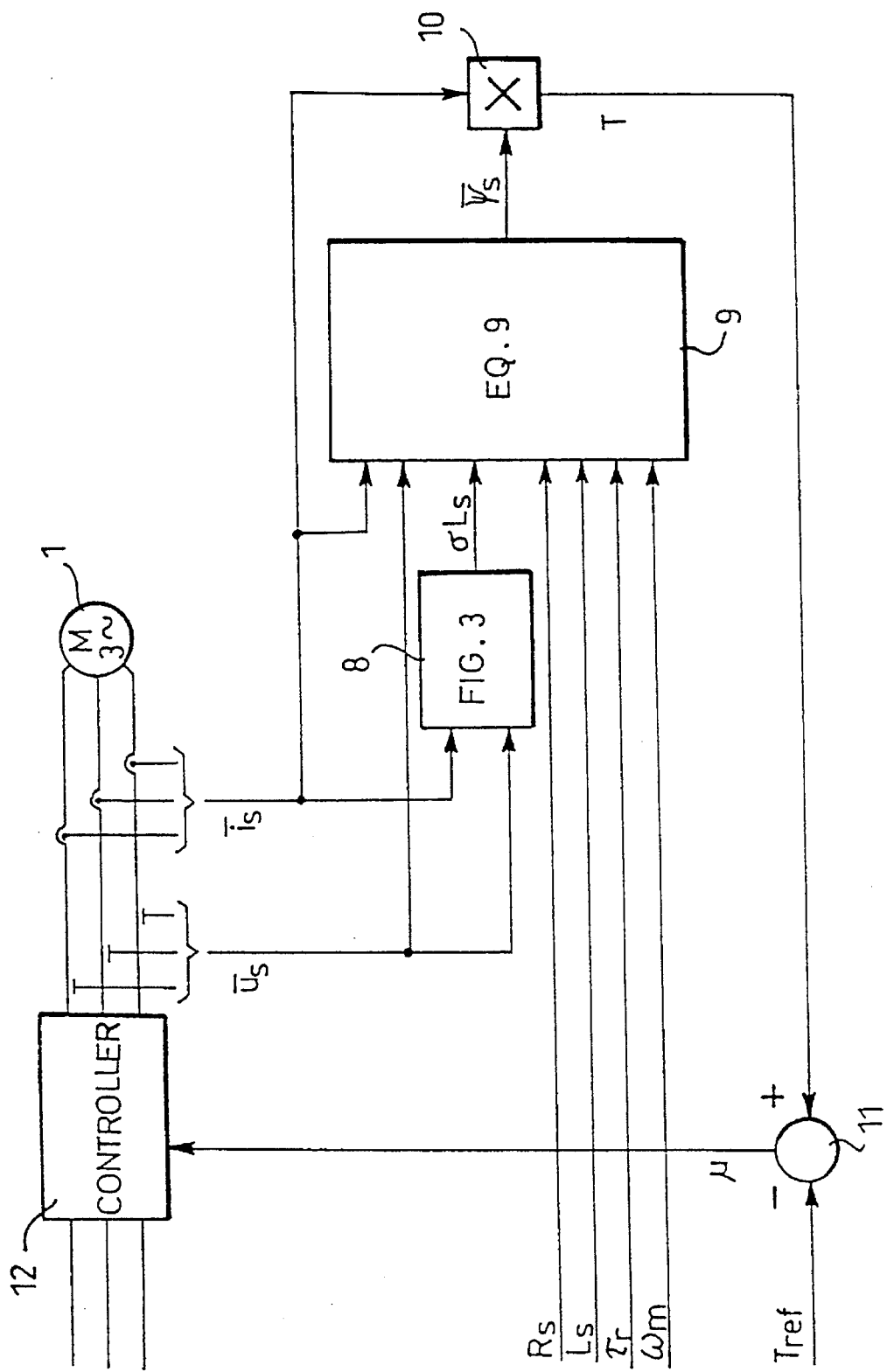
FIG. 4 is a flow chart illustrating how the method of estimating the short-circuit inductance in an asynchronous machine according to the invention is applied in a torque control method for an asynchronous machine.

FIG. 4 is a flow chart illustrating the application of the method according to the invention in a method of controlling torque in an asynchronous machine. The measured stator current and stator voltage of the asynchronous machine 1 are input parameters applied to block 8, which corresponds to the short-circuit inductance estimation method illustrated in FIG. 3. The output parameter $\sigma L_s$ from block 8, $\bar{i}_s$ and $\bar{u}_s$ and the parameters $R_s$, $L_s$, $\tau_r$ and $\omega_m$ assumed to be known are applied to the input of block 9, from the output of which a stator flux estimate satisfying Eq. 9 as accurately as possible is obtained. The flux estimate from block 9 and the measured stator current are applied to the input of block 10, in which a torque estimate T is calculated by using the cross product (Eq. 1). In block 11, a reference value $T_{ref}$ of the torque is subtracted from the obtained torque estimate so as to obtain a control parameter $\mu$. Block 12 is a controller which aims at creating, on the basis of said control parameter, an effect increasing the torque if $\mu<0$, and correspondingly an effect decreasing the torque if $\mu>0$, by varying the current or voltage supplied to the machine.

I claim:

1. Method of determining an instantaneous short circuit inductance in an asynchronous machine during operation thereof, comprising the steps of:

measuring a first stator voltage value and a first stator current derivative value;

generating a step change in the stator voltage immediately after the measurement of said first stator voltage value and the measurement of said first stator current value;

measuring a second stator voltage value and a second stator current derivative value immediately after said step change in the stator voltage;

determining the difference between the first and the second stator voltage values and the first and the second stator current derivative values, respectively, and determining the instantaneous short circuit inductance by forming the quotient of the difference of said first and second stator voltage values and the difference of said first and second stator current derivative values.

2. A method as claimed in claim 1, wherein said step of measuring a first stator voltage value and a first stator current derivative value and said step of measuring a second stator voltage value and a second stator current derivative value occur respectively 100 us before and after said step change in the stator voltage and wherein the rotor time constant is 100 ms.

3. Apparatus for determining an instantaneous short circuit inductance in an asynchronous machine during operation thereof, comprising:

first means for measuring a first stator voltage value and a first stator current derivative value;

means for generating a step change in the stator voltage immediately after the measurement of said first stator voltage value and the measurement of said first stator current value;

second means for measuring a second stator voltage value and a second stator current derivative value immediately after said step change in the stator voltage;

means for determining the difference between the first and the second stator voltage values and the first and the second stator current derivative values, respectively, and means for determining the instantaneous short circuit inductance by forming the quotient of the difference of said first and second stator voltage values and the difference of said first and second stator current derivative values.

4. Apparatus as claimed in claim 3, wherein said first means for measuring and said second means for measuring occur respectively 100 us before and after said step change in the stator voltage and wherein the rotor time constant is 100 ms.

5. A method for controlling torque in an asynchronous machine, comprising the steps of:

measuring a first stator voltage value and a first stator current derivative value;

generating a step change in the stator voltage immediately after the measurement of said first stator voltage value and the measurement of said first stator current value;

measuring a second stator voltage value and a second stator current derivative value immediately after said step change in the stator voltage;

determining the difference between the first and the second stator voltage values and the first and the second stator current derivative values, respectively;

determining the instantaneous short circuit inductance by forming the quotient of the difference of said first and second stator voltage values and the difference of said first and second stator current derivative values;

determining an estimate of the stator flux from said instantaneous short circuit inductance, measured stator voltage and stator current, stator resistance, stator inductance, rotor time constant and the rotation rate of said asynchronous motor in accordance with the equation:

$$\frac{d\bar{\psi}_s}{dt} = \sigma L_s \frac{d\bar{i}_s}{dt} - \frac{1}{\tau_r}(\bar{\psi}_s - L_s \bar{i}_s) + j\omega_m(\bar{\psi}_s - \sigma L_s \bar{i}_s)$$

multiplying said stator flux by the measured value of said stator current to obtain an estimate of the torque of said asynchronous machine;

subtracting a reference torque from said estimate of the torque to obtain a control parameter u; and increasing the torque of said asynchronous machine where u<0 and decreasing said torque where u>0.

6. A method as claimed in claim 5, wherein said step of measuring a first stator voltage value and a first stator current derivative value and said step of measuring a second stator voltage value and a second stator current derivative value occur respectively 100 us before and after said step change in the stator voltage and wherein the rotor time constant is 100 ms.

7. Apparatus for controlling torque in an asynchronous machine, comprising:

first means for measuring a first stator voltage value and a first stator current derivative value;

means for generating a step change in the stator voltage immediately after the measurement of said first stator voltage value and the measurement of said first stator current value;

second means for measuring a second stator voltage value and a second stator current derivative value immediately after said step change in the stator voltage;

means for determining the difference between the first and the second stator voltage values and the first and the second stator current derivative values, respectively;

means for determining the instantaneous short circuit inductance by forming the quotient of the difference of said first and second stator voltage values and the difference of said first and second stator current derivative values;

means for determining an estimate of the stator flux from said instantaneous short circuit inductance, measured stator voltage and stator current, stator resistance, stator inductance, rotor time constant and the rotation rate of said asynchronous motor in accordance with the equation:

$$\frac{d\bar{\psi}_s}{dt} = \sigma L_s \frac{d\bar{i}_s}{dt} - \frac{1}{\tau_r}(\bar{\psi}_s - L_s\bar{i}_s) + j\omega_m(\bar{\psi}_s - \sigma L_s\bar{i}_s)$$

means for multiplying said stator flux by the measured value of said stator current to obtain an estimate of the torque of said asynchronous machine;

means for subtracting a reference torque from said estimate of the torque to obtain a control parameter u; and means for increasing the torque of said asynchronous machine where u<0 and decreasing said torque where u>0.

8. A method as claimed in claim 6, wherein said first means for measuring and said second means for measuring operate respectively 100 us before and after said step change in the stator voltage and wherein the rotor time constant is 100 ms.

* * * * *